(12) United States Patent
Huang et al.

(10) Patent No.: US 10,468,437 B2
(45) Date of Patent: Nov. 5, 2019

(54) MESAS AND IMPLANTS IN TWO-DIMENSIONAL ARRAYS

(71) Applicant: Sensors Unlimited, Inc., Princeton, NJ (US)

(72) Inventors: Wei Huang, Plainsborough, NJ (US); Wei Zhang, West Windsor, NJ (US); Joshua Lund, Dallas, TX (US); Namwoong Paik, Lawrenceville, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 15/935,080

(22) Filed: Mar. 26, 2018

(65) Prior Publication Data

US 2019/0296058 A1    Sep. 26, 2019

(51) Int. Cl.
*H01L 21/02* (2006.01)
*H01L 27/144* (2006.01)
*H01L 31/109* (2006.01)
*H01L 31/0352* (2006.01)
*H01L 31/0304* (2006.01)
*H01L 31/0216* (2014.01)
*H01L 31/18* (2006.01)

(52) U.S. Cl.
CPC ...... *H01L 27/1446* (2013.01); *H01L 27/1443* (2013.01); *H01L 31/02161* (2013.01); *H01L 31/03042* (2013.01); *H01L 31/03046* (2013.01); *H01L 31/035281* (2013.01); *H01L 31/109* (2013.01); *H01L 31/1844* (2013.01)

(58) Field of Classification Search
CPC .................................................. H01L 27/1446
USPC ........................................................ 257/437
See application file for complete search history.

(56) References Cited

U.S. PATENT DOCUMENTS 10,157,954 B2 * 12/2018 Na ...................... H01L 27/1443
2008/0273236 A1   11/2008 Moodie
2015/0349151 A1   12/2015 Mollard et al.

* cited by examiner

*Primary Examiner* — Ajay Arora
(74) *Attorney, Agent, or Firm* — Locke Lord LLP; Scott D. Wofsy; Joshua L. Jones

(57) ABSTRACT

A photodiode includes an absorption layer. A cap layer is disposed on a surface of the absorption layer. A pixel diffusion area within the cap layer extends beyond the surface of the absorption layer and into the absorption layer to receive a charge generated from photons therefrom. A mesa trench is defined through the cap layer surrounding the pixel diffusion area, wherein the mesa trench defines a floor at the surface of the absorption layer and opposed sidewalls extending away from the surface of the absorption layer. An implant is aligned with the mesa trench and extends from the floor of the mesa trench through the absorption layer surrounding a portion of the absorption layer proximate the pixel diffusion area.

20 Claims, 1 Drawing Sheet

MESAS AND IMPLANTS IN TWO-DIMENSIONAL ARRAYS

BACKGROUND OF THE INVENTION

1. Field of the Invention

The present disclosure relates to sensor arrays, and more particularly to pixel structures for two-dimensional arrays.

2. Description of Related Art

Traditional pixels made up of diodes (PN, PiN, Avalanche diodes, etc.), such as those used in photodiode arrays (PDAs), contribute to the dark current and capacitance of the overall PDA. Pixel dark current and capacitance are key factors in determining the pixel performance. Lower values tend to indicate better pixel performance which ultimately translates to better signal to noise ratios at the overall camera and system levels. Pixel dark current and capacitance are significant contributors to the overall camera level noise. The unit pixel design plays a significant role in defining these contributing parameters to system level noise. Crosstalk and modulation transfer function (MTF) are particularly challenging in fine pitch and low dark current detector arrays.

Conventional pixel designs have generally been considered satisfactory for their intended purpose. However, there is still a need in the art for improved designs. This disclosure provides a solution for this need.

SUMMARY OF THE INVENTION

A photodiode includes an absorption layer. A cap layer is disposed on a surface of the absorption layer. A pixel diffusion area within the cap layer extends beyond the surface of the absorption layer and into the absorption layer to receive a charge generated from photons therefrom. A mesa trench is defined through the cap layer surrounding the pixel diffusion area, wherein the mesa trench defines a floor at the surface of the absorption layer and opposed sidewalls extending away from the surface of the absorption layer. An implant is aligned with the mesa trench and extends from the floor of the mesa trench through the absorption layer surrounding a portion of the absorption layer proximate the pixel diffusion area.

The absorption layer can include a semiconductor material able to detect optical signals from a light source through wavelengths ranging from the visible region to the infrared region. A passivation layer can be disposed on a surface of the cap layer opposite the absorption layer. The passivation layer can cover the side walls and floor of the mesa trench. A contact can be disposed on the passivation layer and in electrical contact with the pixel diffusion area through an opening in the passivation layer. A substrate layer can be on a side of absorption layer opposite the cap layer. An anti-reflection layer can be disposed on a side of the substrate layer opposite the absorption layer. The cap layer can include InP, and wherein the absorption layer includes InGaAs, and wherein the implant includes Iron (Fe).

A photodetector includes an absorption layer. A cap layer is disposed on a surface of the absorption layer. An array of pixels diffusion areas is formed in the cap layer, wherein each of the pixel diffusion areas extends beyond the surface of the absorption layer and into the absorption layer to receive a charge generated from photons therefrom. A respective mesa trench is defined through the cap layer surrounding each respective pixel diffusion area, as described above, and a respective implant is aligned with each respective mesa trench as described above so the mesa trenches and implants isolate the pixel diffusion areas from one another.

A method of forming a photodiode includes forming a cap layer on a surface of an absorption layer. A pixel diffusion area is formed in the cap layer, wherein the pixel diffusion area extends beyond the surface of the absorption layer and into the absorption layer to receive a charge generated from photons therefrom. The method includes forming a mesa trench through the cap layer surrounding the pixel diffusion area, so that the mesa trench defines a floor at the surface of the absorption layer and opposed sidewalls extending away from the surface of the absorption layer, and forming an implant through the absorption layer aligned with the mesa trench and extending from the floor of the mesa trench through the absorption layer surrounding a portion of the absorption layer proximate the pixel diffusion area.

Forming the mesa trench can include etching the cap layer. Forming the implant can include using high energy ion implantation by irradiating the floor of the mesa trench at the surface of the absorption layer with an ion beam. The method can include disposing the absorption layer on a substrate layer opposite the cap layer, and disposing an anti-reflection coating on the substrate layer opposite the absorption layer. The method can include disposing a passivation layer on the cap layer opposite the absorption layer so the passivation layer covers the floor and sidewalls of the mesa trench. The method can include disposing a contact on the passivation layer so the contact is in electrical contact with the pixel diffusion area through an opening in the passivation layer.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
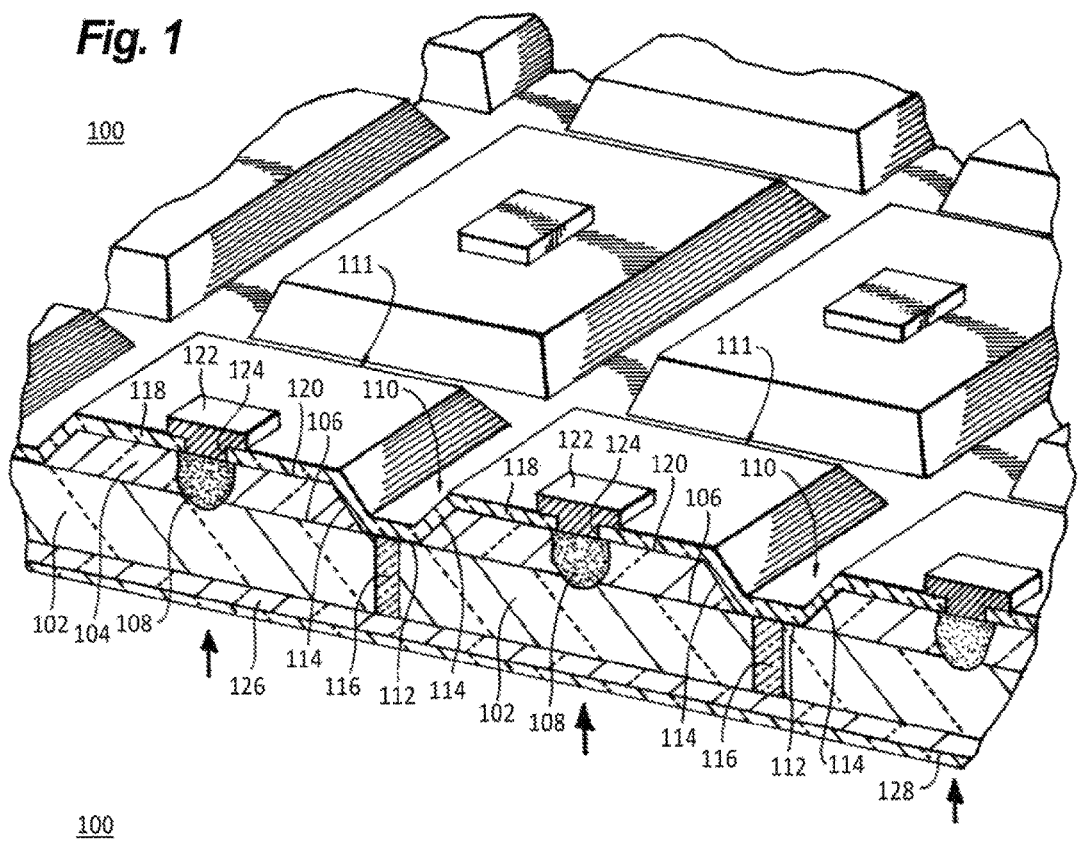
FIG. 1 is a schematic cross-sectional perspective view of an exemplary embodiment of a photodetector constructed in accordance with the present disclosure, showing a mesa trench and implant isolating two pixels from each other.

Reference will now be made to the drawings wherein like reference numerals identify similar structural features or aspects of the subject disclosure. For purposes of explanation and illustration, and not limitation, a partial view of an exemplary embodiment of a photodetector in accordance with the disclosure is shown in FIG. 1 and is designated generally by reference character 100. Other embodiments of photodetectors in accordance with the disclosure, or aspects thereof, are provided in FIG. 2, as will be described. The systems and methods described herein can be used to isolate pixels from one another to reduce cross-talk and improve modulation transfer function (MTF) relative to conventional pixel configurations.

Figure 2:
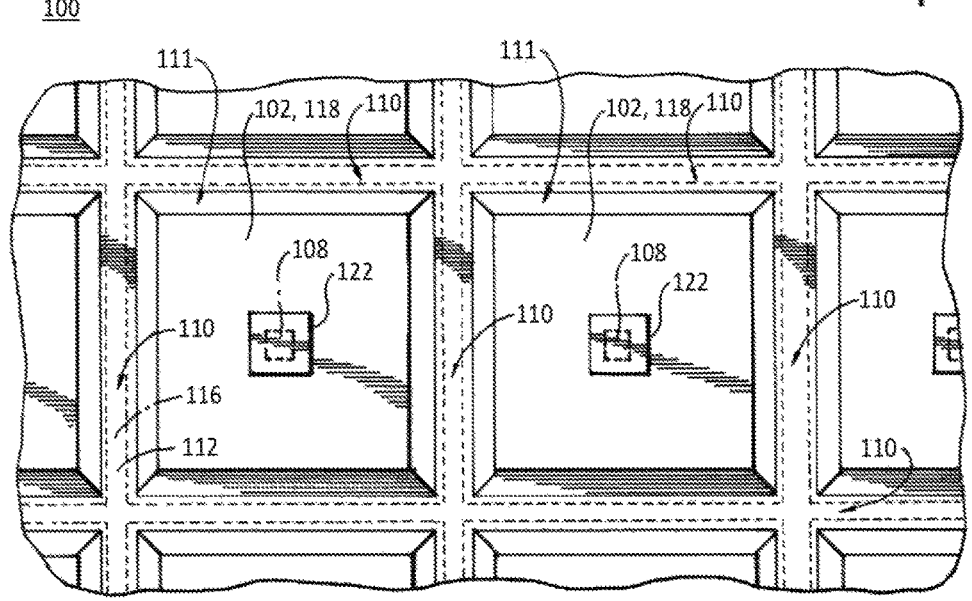
FIG. 2 is a plan view of the photodetector of FIG. 1, showing the trenches and mesa trenches surrounding each pixel.

The photodetector 100 includes an absorption layer 102. The absorption layer 102 includes a semiconductor material able to detect optical signals from a light source through wavelengths ranging from the visible region to the infrared region. The absorption layer 102 can include an InGaAs material, for example. A cap layer 104 is disposed on a surface 106 of the absorption layer 102. The cap layer can include an InP material. A two-dimensional array of pixels diffusion areas 108 is formed in the cap layer 104. Each of the pixel diffusion areas 108 extends beyond the surface 106 of the absorption layer 102 and into the absorption layer 102 to receive a charge generated from photons from the absorption layer 102. A respective mesa trench 110 is defined through the cap layer 104 surrounding each respective pixel diffusion area 108, as shown in FIG. 2 where only two adjacent pixel diffusion areas 108 are shown for sake of clarity. Those skilled in the art will readily appreciate that any suitable number and shape of pixels can be included without departing from the scope of this disclosure.

Referring again to FIG. 1, each mesa trench 110 defines a floor 112 at the surface 106 of the absorption layer 102. Each mesa trench 110 also defines two obliquely angled, opposed sidewalls 114 extending away from the surface 106 of the absorption layer 102. An implant 116 is aligned with the mesa trench 110 and extends from the floor 112 of the mesa trench 110 through the absorption layer 102 surrounding a portion of the absorption layer 102 proximate the pixel diffusion area 108. The implant includes Iron (Fe). The mesa trenches 110 and implants 116 isolate the pixel diffusion areas 108 from one another to reduce pixel to pixel cross-talk, where the mesa trenches 110 isolate at the cap layer 104 level, and the implants 116 isolate at the absorption layer 102 level. As shown in FIG. 1, the mesa trench 110 and implant form a barrier between adjacent pixels 111 (where the pixels 111 each include a respective pixel diffusion area 108 and adjacent portion of the absorption layer 102) extending completely through the cap layer 104 and absorption layer 102. As shown in FIG. 2, the mesa trench 110 and implant 116 form a barrier that extends completely around the perimeter of each pixel 111, isolating each pixel 111 from its neighbors.

A passivation layer 118 is disposed on a surface 120 of the cap layer 104 opposite the absorption layer 102. The passivation layer 118 covers the top of the cap layer 104, the side walls 114 and floor 112 of the mesa trenches 110. A respective contact 122, e.g., a metallic contact, is disposed on the passivation layer 118 in electrical contact with each respective pixel diffusion area 108 through a respective opening 124 in the passivation layer 118. A substrate layer 126 is on a side of absorption layer 102 opposite the cap layer 104. An anti-reflection layer 128 is disposed on a side of the substrate layer 126 opposite the absorption layer 102 to reduce unwanted reflections as light enters the photodetector 100 as indicated by the large arrows in FIG. 1.

A method of forming a photodiode includes forming an absorption layer 102 on a substrate 126. The method includes forming a cap layer 104 on a surface 106 of the absorption layer 102 opposite the substrate 126. A pixel diffusion area 108 is formed in the cap layer 104, wherein the pixel diffusion area 108 extends beyond the surface 106 of the absorption layer 102 and into the absorption layer 102 to receive a charge generated from photons therefrom. The method includes forming a mesa trench 110 through the cap layer 104 surrounding the pixel diffusion area 108, so that the mesa trench 110 defines a floor 112 at the surface 106 of the absorption layer 102 and opposed sidewalls 114 extending away from the surface 106 of the absorption layer 102. The method includes forming an implant 116 through the absorption layer 102 aligned with the mesa trench 110 and extending from the floor 112 of the mesa trench 110 through the absorption layer 102 surrounding a portion of the absorption layer 102 proximate the pixel diffusion area 108.

Forming the mesa trench 110 can include wet and/or dry etching the cap layer 104. Forming the implant 116 can include using high energy Iron implantation by irradiating the floor 112 of the mesa trench 110 at the surface 106 of the absorption layer 102 with an ion beam. Forming the implant 116 after forming the mesa trench 110 reduces the power required to form the implant 116, since the ion beam does not have to penetrate through the cap layer 104. It is also possible to form the implant 116 prior to disposing the cap layer on the absorption layer 102. A passivation layer 118 can be disposed on the cap layer 104 opposite the absorption layer 102 so the passivation layer 118 covers the top of the cap layer 104, the floor 112 and sidewalls 114 of the mesa trench 110. The method includes disposing a contact 122 on the passivation layer 118 so the contact is in electrical contact with the pixel diffusion area 108 through an opening 124 in the passivation layer 118.

Using implants 116 reduces the size of the mesa trench 110 that would otherwise be required to provide the complete level of isolation provided by the systems and methods disclosed herein. This reduced size mesa trench 110 reduces pitch size for the pixels 111. The mesa trenches 110 reduce the amount of energy required, and the associated risks of damage, required to form the implants 116.

The methods and systems of the present disclosure, as described above and shown in the drawings, provide for photodetector arrays with superior properties including reduced cross-talk and improved modulation transfer function (MTF) relative to conventional pixel configurations. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A photodiode comprising:
   an absorption layer;
   a cap layer disposed on a surface of the absorption layer; and
   a pixel diffusion area within the cap layer and extending beyond the surface of the absorption layer and into the absorption layer to receive a charge generated from photons therefrom, wherein a mesa trench is defined through the cap layer surrounding the pixel diffusion area, wherein the mesa trench defines a floor at the surface of the absorption layer and opposed sidewalls extending away from the surface of the absorption layer, and wherein an implant is aligned with the mesa trench and extends from the floor of the mesa trench through the absorption layer surrounding a portion of the absorption layer proximate the pixel diffusion area.

2. The photodiode as recited in claim 1, wherein the absorption layer includes a semiconductor material able to detect optical signals from a light source through wavelengths ranging from the visible region to the infrared region.

3. The photodiode as recited in claim 1, further comprising a passivation layer disposed on a surface of the cap layer opposite the absorption layer, wherein the passivation layer covers the side walls and floor of the mesa trench.

4. The photodiode as recited in claim 3, further comprising a contact disposed on the passivation layer and in electrical contact with the pixel diffusion area through an opening in the passivation layer.

5. The photodiode as recited in claim 1, further comprising a substrate layer on a side of absorption layer opposite the cap layer.

6. The photodiode as recited in claim 5, further comprising an anti-reflection layer disposed on a side of the substrate layer opposite the absorption layer.

7. The photodiode as recited in claim 1, wherein the cap layer includes InP and wherein the absorption layer includes InGaAs, and wherein the implant includes Iron (Fe).

8. A photodetector comprising:
an absorption layer;
a cap layer is disposed on a surface of the absorption layer; and
an array of pixels diffusion areas formed in the cap layer, wherein each of the pixel diffusion areas extends beyond the surface of the absorption layer and into the absorption layer to receive a charge generated from photons therefrom, wherein a respective mesa trench is defined through the cap layer surrounding each respective pixel diffusion area, wherein each respective mesa trench defines a floor at the surface of the absorption layer and opposed sidewalls extending away from the surface of the absorption layer, and wherein a respective implant is aligned with each respective mesa trench and extends from the floor of the respective mesa trench through the absorption layer surrounding a portion of the absorption layer proximate the respective pixel diffusion area so the mesa trenches and implants isolate the pixel diffusion areas from one another.

9. The photodetector as recited in claim 8, wherein the absorption layer includes a semiconductor material able to detect optical signals from a light source through wavelengths ranging from the visible region to the infrared region.

10. The photodetector as recited in claim 8, further comprising a passivation layer disposed on a surface of the cap layer opposite the absorption layer, wherein the passivation layer covers the side walls and floors of the mesa trenches.

11. The photodetector as recited in claim 10, further comprising a respective contact seated on the passivation layer and in electrical contact with each respective pixel diffusion area through a respective opening in the passivation layer.

12. The photodetector as recited in claim 8, further comprising a substrate layer on a side of absorption layer opposite the cap layer.

13. The photodetector as recited in claim 12, further comprising an anti-reflection layer disposed on a side of the substrate layer opposite the absorption layer.

14. The photodetector as recited in claim 8, wherein the cap layer includes InP and wherein the absorption layer includes InGaAs, and wherein the implant includes Iron (Fe).

15. A method of forming a photodiode comprising:
forming a cap layer on a surface of an absorption layer;
forming a pixel diffusion area in the cap layer, wherein the pixel diffusion area extends beyond the surface of the absorption layer and into the absorption layer to receive a charge generated from photons therefrom;
forming a mesa trench through the cap layer surrounding the pixel diffusion area, so that the mesa trench defines a floor at the surface of the absorption layer and opposed sidewalls extending away from the surface of the absorption layer; and
forming an implant through the absorption layer aligned with the mesa trench and extending from the floor of the mesa trench through the absorption layer surrounding a portion of the absorption layer proximate the pixel diffusion area.

16. The method as recited in claim 15, wherein forming the mesa trench includes etching the cap layer.

17. The method as recited in claim 15, wherein forming the implant includes using high energy ion implantation by irradiating the floor of the mesa trench at the surface of the absorption layer with an ion beam.

18. The method as recited in claim 15, further comprising disposing the absorption layer on a substrate layer opposite the cap layer, and disposing an anti-reflection coating on the substrate layer opposite the absorption layer.

19. The method as recited in claim 18, further comprising disposing a passivation layer on the cap layer opposite the absorption layer so the passivation layer covers the floor and sidewalls of the mesa trench.

20. The method as recited in claim 19, further comprising disposing a contact on the passivation layer so the contact is in electrical contact with the pixel diffusion area through an opening in the passivation layer.

\* \* \* \* \*